(12) United States Patent
Lee et al.

(10) Patent No.: US 8,085,572 B2
(45) Date of Patent: Dec. 27, 2011

(54) SEMICONDUCTOR MEMORY APPARATUS

(75) Inventors: Sang Don Lee, Guri-si (KR); Jung Ho Lee, Yongin-si (KR); Tae Su Jang, Gwacheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 223 days.

(21) Appl. No.: 12/264,832

(22) Filed: Nov. 4, 2008

(65) Prior Publication Data

US 2009/0296453 A1 Dec. 3, 2009

(30) Foreign Application Priority Data

May 28, 2008 (KR) .................. 10-2008-0049891

(51) Int. Cl.
*G11C 11/22* (2006.01)
*G11C 11/24* (2006.01)
*G11C 7/00* (2006.01)
(52) U.S. Cl. ......... 365/145; 365/149; 365/203; 365/222
(58) Field of Classification Search .................. 365/145, 365/149, 222, 203
See application file for complete search history.

(56) References Cited

U.S. PATENT DOCUMENTS

| 4,760,556 | A | | 7/1988 | Deguchi et al. | 365/149 |
|---|---|---|---|---|---|
| 5,654,913 | A | * | 8/1997 | Fukushima et al. | 365/149 |
| 6,996,007 | B2 | * | 2/2006 | Ahn et al. | 365/149 |
| 7,099,181 | B2 | * | 8/2006 | Ahn et al. | 365/149 |
| 7,254,051 | B2 | * | 8/2007 | Takashima | 365/145 |
| 7,440,353 | B2 | * | 10/2008 | Kim et al. | 365/222 |
| 7,539,041 | B2 | * | 5/2009 | Kim et al. | 365/149 |
| 7,684,228 | B2 | * | 3/2010 | Shore et al. | 365/149 |
| 7,701,751 | B2 | * | 4/2010 | Kang et al. | 365/149 |
| 2005/0047194 | A1 | | 3/2005 | Ahn et al. | 365/149 |

FOREIGN PATENT DOCUMENTS

| JP | 09-246483 | 9/1997 |
|---|---|---|
| KR | 10-0147352 | 5/1998 |

OTHER PUBLICATIONS

Notice of Rejection for corresponding Korean Application No. 10-2008-0049891, dated Jul. 21, 2009.

* cited by examiner

*Primary Examiner* — Trong Phan
(74) *Attorney, Agent, or Firm* — Marshall, Gerstein & Borun LLP

(57) ABSTRACT

A semiconductor memory apparatus includes a unit cell with a transistor having a floated body and a capacitor for storing charges; a word line for activating the unit cell; and a bit line for transmitting data to the unit cell.

11 Claims, 3 Drawing Sheets

SEMICONDUCTOR MEMORY APPARATUS

CROSS-REFERENCE TO RELATED APPLICATION

Priority is claimed to Korean patent application number 10-2008-0049891, filed on May 28, 2008, which is incorporated by reference in its entirety.

BACKGROUND OF THE INVENTION

The present invention relates to a semiconductor memory apparatus, and more particularly, to structure and operating method of the semiconductor memory apparatus for solving a problem occurred in a unit cell because of high-integration.

In a system constituted with a plurality of semiconductor devices, a semiconductor memory apparatus is configured to store data generated or processed therein. For example, if a request from a data processor such as a central processing unit (CPU) is received, the semiconductor memory apparatus outputs data to the data processor from unit cells therein or stores data processed by the data processor to the unit cells, according to an address transmitted with the request.

Recently, data storage capacity of the semiconductor memory apparatus is increased, but the size of the semiconductor memory apparatus is not increased proportionally. Thus, each of plural unit cells included in the semiconductor memory apparatus is dwindled, and the sizes of various components and elements for read or write operations are also reduced. Accordingly, components and elements duplicated unnecessarily in the semiconductor memory apparatus, such as transistors or wires, are combined or merged to lesson the area occupied by each component. Particularly, the reduction of the size of unit cells included in the semiconductor memory apparatus affects improvement of integration because the unit cells occupy one of the largest areas therein.

FIG. 1 is a circuit diagram illustrating a unit cell included in a conventional semiconductor memory apparatus. In particular, FIG. 1 shows a Dynamic Random Access Memory (DRAM) which is a type of volatile memory device configured to retain data while a power source is supplied.

As shown, the unit cell comprises a transistor serving as a switch and a capacitor functioning as a data storage unit. One of the source/drain regions of the transistor is connected to a bit line BL, and the other of source/drain regions is connected to a storage node (SN). A gate of the transistor is connected to a word line WL, and a body of the transistor is connected to a body voltage $V_{BB}$.

When a high voltage $V_{PP}$ is supplied to the word line, the unit cell is activated to transmit charges corresponding to a logic level of data "1" or "0" through the bit line and to store the charges in the capacitor. A driving voltage supplied to the word line to activate the unit cell may include a power voltage $V_{DD}$ or a core voltage $V_{CORE}$ which has a lower level than the high voltage $V_{PP}$ depending on specifications of the semiconductor memory apparatus. Nevertheless the high voltage is generally supplied on the word line for turning on the transistor. When a voltage level supplied to the gate of the transistor is higher, transmitted data through the transistor may be freer from a threshold voltage of the transistor and, as a result, distortion or degradation of data is prevented.

As the voltage corresponding to the logic level of data "1" or "0" transmitted onto the storage node SN of the unit cell, a core voltage or a ground voltage (0V) is generally used. Also, a half of core voltage $0.5*V_{CORE}$ is supplied to the other side of the capacitor as a plate voltage. In this case, a potential difference of $+0.5*V_{CORE}$ is maintained between both ends of the capacitor when the data "1" is delivered to the unit cell, and a potential difference of $0.5*V_{CORE}$ is kept between both the ends of the capacitor when the data "0" is transmitted.

After the data "1" is delivered to the capacitor, charges that are temporarily stored in the storage node are dissipated, i.e., amount of the charges are reduced, because of several leakage currents that are generated in junction of the storage nodes or instinctive characteristics of the capacitor as time goes by. In order to prevent the reduction of charges, numerous methods for increasing a capacitance ($C_s$) of the capacitor included in the unit cell have been suggested so that more charges may be stored in the storage node and for a longer time after the charges are inputted to the unit cell through the write operation. For example, a prior insulating film of the capacitor, e.g., an oxide film, is replaced with an advanced insulating film which has a larger dielectric constant such as a nitrified oxide film and a high dielectric film. Otherwise, the capacitor having a two-dimensional structure is changed to have a three-dimensional cylinder structure or a trench structure, thereby increasing the surface of both electrodes of the capacitor.

As the design rule is reduced, the plane area where a capacitor can be formed is reduced. Thus, in order to form a capacitor having a higher height in a narrow area, a material having a high aspect ratio is used. Yet, as the plane area for the capacitor is continuously reduced, there is a limit to increasing the height or depth of the capacitor.

As it is difficult to develop materials for forming the insulating film in the capacitor, it remains difficult to secure capacitance of the capacitor of more than 25 fF which is suitable for the semiconductor memory apparatus that reads or writes data as well as performs a refresh operation to prevent distortion of the data under the design rule of less than 50 nm. Moreover, as a junction resistance of the storage node in the unit cell and a turn-on resistance of the transistor increase under the reduction of the design rule, performing the read and write operations become more difficult.

FIG. 2 is a circuit diagram illustrating a unit cell of a floating body transistor semiconductor memory apparatus.

As shown, the unit cell includes one transistor without any capacitor used to store data. A body of the one transistor included in the unit cell is floated, not connected to the body voltage. It's called a floating body (FB) transistor. In a write mode of the unit cell, a voltage level supplied on the word line coupled to a gate of the FB transistor is reduced by ½ or ⅓ of the voltage level corresponding to the logic level of data '1', which may be supplied to one source/drain region of the FB transistor through the bit line, in order to generate a lot of hot carriers. At this time, a source line (SL) which is the other source/drain region of the FB transistor is connected to a ground voltage (GND).

When the data "1" is delivered, a large amount of hot carriers are generated in a junction region between the FB transistor and the bit lines BL during the write mode. Then, electrons are slipped out into the bit line BL but holes remain in the floating body FB. Otherwise, when the data "0" is transmitted, the hot carriers are not generated in the junction region, so that any hole does not remain in the floating body FB.

On the read mode, the holes kept in the floating body lower a threshold voltage of the transistor of the unit cell; and, as a result, amount of a current flowing through a channel of the transistor increases. That is, the amount of the current flowing when the holes are stored in the floating body of the transistor is larger than that flowing when no holes are stored. This phenomenon may be possible to distinguish whether the data "1" or "0" is stored in the unit cell.

The unit cell shown in FIG. 2 does not include a capacitor that has occupied a relatively large area in a conventional unit cell, thereby improving the integration of the semiconductor memory apparatus. However, it is difficult to prevent reduction of the amount of holes that the floating body of the FB transistor stores because of a leakage current that occurs at a source line (SL) junction or a bit line junction.

Generally, the active region (e.g., source/drain region) of the FB transistor, which is connected to the bit line or the source line (SL), includes impurities of high concentration in order to reduce resistance resulting from junction with metal layers. However, if the active region of the FB transistor is doped with impurities of high concentration, the amount of leakage current between the active region and the floating body may increase. As a result, the amount of holes stored in the floating body is dissipated as time goes by. Also, since the amount of the leakage current increases in proportion to temperature, data stored in the FB transistor of the unit cell is easily deleted under a high temperature. Finally, if the unit cell configured to have only the FB transistor without any capacitor, the semiconductor memory apparatus should perform a refresh operation for securing data more frequently; and performance of the semiconductor memory apparatus is deteriorated.

BRIEF SUMMARY OF THE INVENTION

Various embodiments of the present invention are directed at providing a semiconductor memory apparatus configured to store charges and holes corresponding to data in a capacitor and a floating body of a unit cell to improve refresh performance.

According to an embodiment of the present invention, a semiconductor memory apparatus may include: a unit cell including a transistor whose body is floated and a capacitor for storing charges; a word line for activating the unit cell; and a bit line for transmitting data to the unit cell.

Preferably, inputted data are stored both in the capacitor and the floating body. The floating body stores holes depending on generation of hot carriers determined depending on data delivered through the bit line. The data transmitted through the bit line are stored in the capacitor when a higher voltage than a power voltage is supplied to the word line. The floating body stores holes depending on generation of hot carriers determined corresponding to the data transmitted to the bit line when a voltage level having a range in ⅓ to ½ of a voltage level corresponding to data "1". The unit cell connected to the word line is inactivated when a lower voltage than a voltage level corresponding to data "0" is supplied. The bit line maintains a precharge voltage when data are not transmitted. A voltage having the same voltage level as that of the precharge voltage is supplied to a plate connected to one side of the capacitor. A threshold voltage of the transistor is lowered when a logic level corresponding to the data "1" is stored in the unit cell.

According to an embodiment of the present invention, a method for operating a semiconductor memory device may include: sequentially storing data in a capacitor and a floating body of a transistor in a unit cell in response to a write command; outputting data from the unit cell in response to a read command; and sequentially refreshing the capacitor and the floating body in response to a refresh command.

Preferably, the bit line maintains a precharge voltage and the word line maintains an inactivating voltage when the unit cell is not selected. A voltage having the same level as that of the precharge voltage is supplied to the plate connected to one side of the capacitor.

Preferably, sequentially storing data includes: supplying a first control voltage to the word line to store data transmitted to the bit line in the capacitor; supplying a second control voltage to the word line to store the data in the floating body; and supplying an inactivating voltage to the word line to inactivate the unit cell.

Preferably, the supplying a second control voltage includes: supplying a high data voltage having a higher level than a logic high level corresponding to data "1" to the bit line when the data is "1"; reserving a plurality of holes in the floating body through hot carriers formed corresponding to the second control voltage and the high data voltage; and supplying a logic low level corresponding to data "0" to the bit line to prevent generation of hot carriers when the data is "0".

Preferably, the first control voltage is a higher voltage than a power voltage, and the second control voltage has a potential within a range of ⅓~½ of the logic high level or the high data voltage level. When a first voltage includes a voltage sufficient to maintain an inverse direction when the holes are not stored in the floating body and a voltage rising value of the floating body when the holes are stored, and a second voltage includes the first voltage and a voltage rising value of the floating body depending on a potential of the word line which changes from an inactivating voltage to a high voltage, a potential of the logic low level is higher than the first voltage and lower than the second voltage.

Preferably, sequentially refreshing the capacitor and the floating body includes: supplying a first control voltage to a word line to output and amplify data from the unit cell; supplying the first control voltage to the word line to store data transmitted to the bit line in the capacitor; supplying a second control voltage to the word line to store the data in the floating body; and supplying an inactivating voltage to the word line to inactivate the unit cell.

Preferably, the first control voltage is a higher voltage than a power voltage, and the second control voltage has a potential within a range of ⅓~½ of a logic high level corresponding to data "1" or the high data voltage level. The inactivating voltage has a potential lower than the logic low level corresponding to data "0".

DESCRIPTION OF EMBODIMENTS

According to an embodiment of the present invention, a semiconductor memory apparatus may include a plurality of unit cells each having one transistor whose body is floated and one capacitor for storing charges, a plurality of word lines for activating the unit cells, and a plurality of bit lines for transmitting data to the unit cells.

Figure 3:
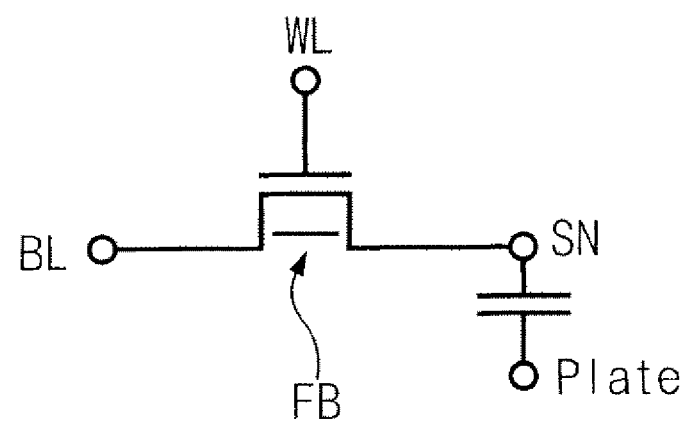
FIG. 3 is a circuit diagram illustrating a unit cell of a semiconductor memory apparatus according to an embodiment of the present invention.

FIG. 3 is a circuit diagram illustrating a unit cell of a semiconductor memory apparatus according to an embodiment of the present invention.

Figure 2:
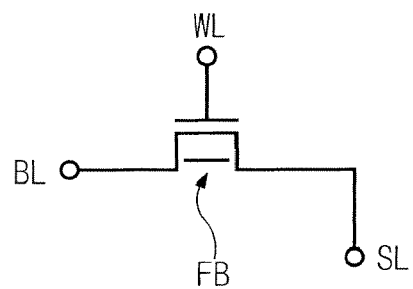
FIG. 2 is a circuit diagram illustrating a unit cell of a floating body transistor semiconductor memory apparatus.

Referring to FIG. 3, the unit cell of the depicted semiconductor memory apparatus includes one transistor and one capacitor. In order to prevent generation of leakage currents by source line junction or bit line junction, a capacitor is connected to one side of the transistor in the unit cell of FIG. 2. Unlike the conventional art where the body of the transistor is connected to a body voltage, the body of the transistor is floated. As a result, data can be stored in the capacitor although holes stored in the floating body are eliminated as time goes by, thereby preventing the generation of leakage currents.

That is, since the size of the capacitor becomes smaller due to a reduction of the design rule, a unit cell of the conventional semiconductor memory apparatus does not secure sufficient capacitance of the capacitor. However, in the semiconductor memory apparatus according to an embodiment of the present invention, the body of the transistor is floated to store holes, so that although the capacitance of the capacitance is small, the storage time of data can be enlarged, and it is not necessary to design the capacitor to have more capacitance. In comparison with the unit cell of FIG. 2 configured only to store holes corresponding to data in the floating body of the transistor, the unit cell of FIG. 3 stores date for a longer time period, thereby improving a refresh characteristic of the semiconductor memory apparatus.

Figure 4:
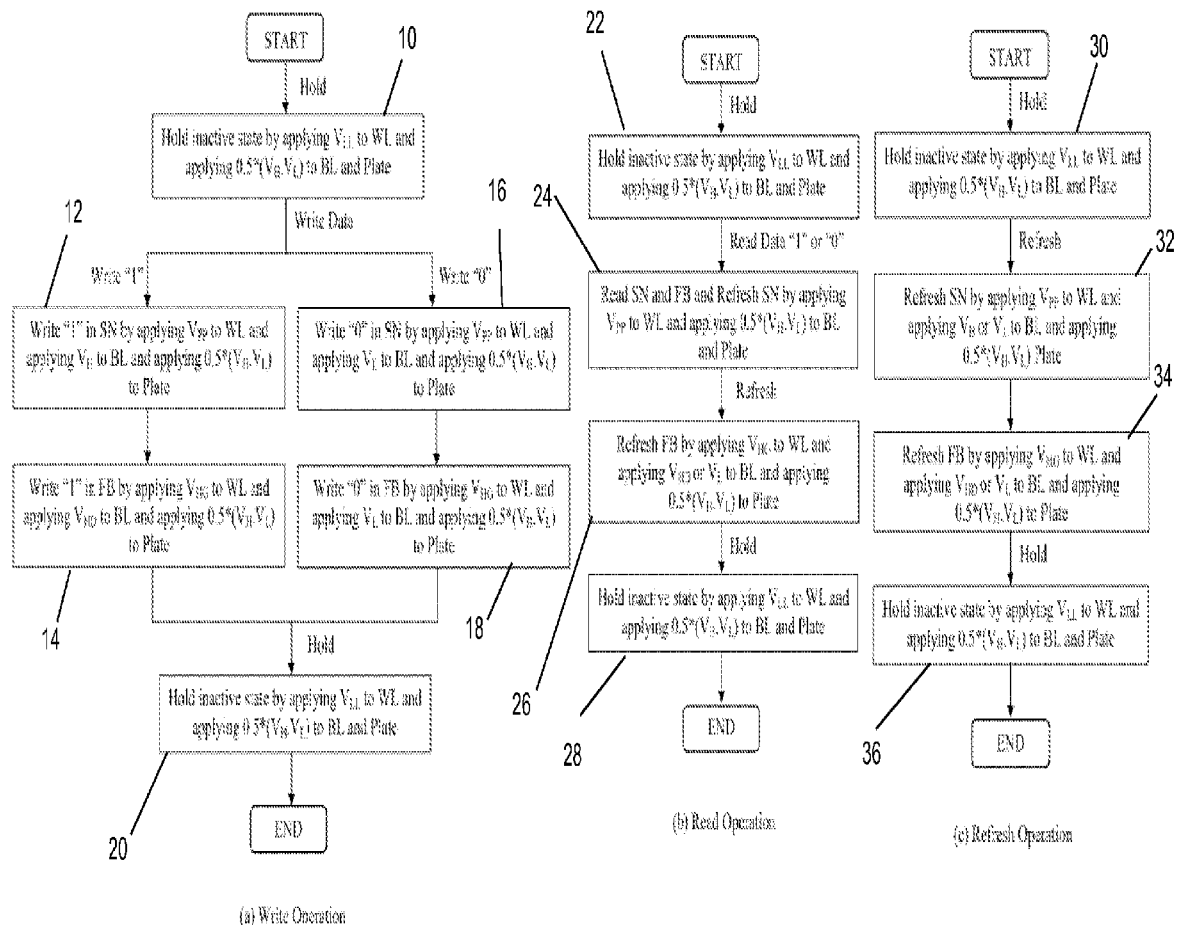
FIG. 4 is a table illustrating an operating method of the semiconductor memory apparatus of FIG. 3.

FIG. 4 is a table illustrating an operating method of the semiconductor memory apparatus of FIG. 3.

Referring to FIG. 4, the operation of the semiconductor memory apparatus includes a write operation ((a) Write Operation), a read operation ((b) Read Operation) and a refresh operation ((c) Refresh Operation). In the write operation ((a) Write Operation), data "1" or "0" is transmitted and stored in the inactivated unit cell, so that the unit cell remains inactivated. In the read operation ((b) Read Operation), the inactivated unit cell is activated to read the data "1" or "0" stored in the unit cell, and a storage node (SN) of the unit cell is refreshed, so that the storage node (SN) remains inactivated. In the refresh operation ((c) Refresh Operation), the inactivated unit cell is selected to apply a voltage for refreshing the storage node (SN) and the floating body (FB), so that the unit cell remains inactivated. Hereinafter, a voltage level supplied to the word line (WL), the bit line (BL) and the plate for performing each operation is described.

Referring again to FIG. 4, in the write operation ((a) Write Operation at reference number 10), while the unit cell of the semiconductor memory apparatus is inactivated, an inactive voltage ($V_{LL}$) is supplied to the word line (WL) connected to a gate of the transistor in the unit cell, and a precharge voltage ($0.5*(V_H-V_L)$) is supplied to the bit line (BL) connected to one side of the transistor and to the plate connected to one side of the capacitor included in the unit cell. The inactive voltage ($V_{LL}$) has a voltage level for keeping the transistor turned-off, which is lower than a logic low level voltage ($V_L$). The precharge voltage has a middle value of the logic high level voltage ($V_H$) corresponding to the data "1" and the logic low level voltage ($V_L$) corresponding to the data "0".

When the data "1" or "0" is written in the inactivated unit cell (Write Data), a high voltage ($V_{PP}$) is supplied to the word line (WL) so that the data "1" or "0" supplied to the bit line (BL) is transmitted to the storage node (SN) while the loss of the data is minimized. For example, with reference to FIG. 4 at reference number 12, data "1" can be written in the storage node (SN) by applying the high voltage ($V_{PP}$) to the word line (WL), applying the high logic level voltage ($V_H$) to the bit line (BL), and applying the precharge voltage ($0.5*(V_H-V_L)$) to the plate. For example, with reference to FIG. 4 at reference number 16, data "0" can be written in the storage node (SN) by applying the high voltage ($V_{PP}$) to the word line (WL), applying the low level logic voltage $V_L$ to the bit line (BL), and applying the precharge voltage ($0.5*(V_H-V_L)$) to the plate. To store data in the floating body, the semiconductor memory apparatus applies a high gate voltage ($V_{HG}$), which has a logic high level or a ⅓~½ level of a high data voltage ($V_{HD}$) level, to the word line (WL), and applies a voltage level for storing data in the floating body to the bit line (BL). When the data transmitted to the unit cell is "1", the high data voltage ($V_{HD}$) having a higher level than the logic high level voltage ($V_H$) to store data in the floating body is supplied to the bit line (BL), a high gate voltage ($V_{HG}$) is supplied to word line (WL), and the precharge voltage ($0.5*(V_H-V_L)$) is supplied to the late. (FIG. 4 at reference number 14). As a result, hot carriers are generated in the junction region to which the high data voltage ($V_{HD}$) is supplied. Electrons of the hot carriers are slipped out to the junction region, and holes are stored in the floating body of the transistor of the unit cell. The hot carriers for storing the data "1" in the floating body may be generated when the high gate voltage ($V_{HG}$) or the inactive voltage ($V_{LL}$) is supplied to the word line (WL), and the logic high level voltage ($V_H$) or the high data voltage ($V_{HD}$) having a higher level than the logic high level ($V_H$) is supplied to the bit line (BL). On the other hand, when the data "0" is written in the unit cell, a logic low level ($V_L$) is supplied to the bit line (BL), the high gate voltage ($V_{HG}$) is supplied to the word line (WL), and the precharge voltage ($0.5*(V_H-V_L)$) is supplied to the plate (FIG. 4 at reference number 18). In this case, hot carriers are not generated in the junction region, so that virtually no holes remain in the floating body.

After the data are sequentially written in the storage node (SN) and the floating body (FB), the inactive voltage ($V_{LL}$) is supplied to the word line (WL) to inactivate the unit cell and the precharge voltage ($0.5*(V_H-V_L)$) is applied to precharge the bit line (BL) with the precharge voltage ($0.5*(V_H-V_L)$) (FIG. 4 at reference number 20).

In the read operation ((b) Read Operation), the bit line (BL) is maintained with the precharge voltage ($0.5*(V_H-V_L)$) before the unit cell is activated when the inactive voltage ($V_{LL}$) is supplied to the word line (WL) (FIG. 4 at reference number 22). A high voltage ($V_{PP}$) is supplied to the word line (WL) to activate the unit cell, the data, which are stored in the storage node (SN) and the floating body (FB) of the unit cell, are transmitted to the bit line (BL) (FIG. 4 at reference number 24). The bit line (BL) has a voltage level which rises or falls by data outputted from the unit cell. If a potential of the bit line (BL) changes by transmission of the data, the sense amplifier (not shown) amplifies and transmits the potential difference. The amplified data is transmitted and stored in the original unit cell. That is, while the high voltage ($V_{PP}$) is supplied to the word line (WL), the amplified data is transmitted and stored in the storage node (SN) of the unit cell. (FIG. 4 at reference number 24) Then, the high gate voltage ($V_{HG}$) is supplied to the word line (WL), so that virtually no holes remain in the floating body (FB) through generation of hot carriers depending on the state of the data supplied to the bit line (BL). For example, the high gate voltage ($V_{HG}$) is supplied to the word line (WL) and the high data voltage ($V_{HD}$) or the logic level low voltage ($V_L$) is applied to the bit line (BL) for refreshing the floating gate (FB) (FIG. 4 at reference number 26). After the storage node (SN) and the floating body (FB) are restored to the state corresponding to the originally stored data, the inactive voltage ($V_{LL}$) is supplied to the word line (WL), and the bit line (BL) is precharged with the precharge voltage ($0.5*(V_H-V_L)$). (FIG. 4 at reference number 28).

In the refresh operation ((c) Refresh Operation), the inactive voltage ($V_{LL}$) is supplied to the word line (WL), and the storage node (SN) and the floating body (FB) of the unit cell are sequentially refreshed while the bit line (BL) is precharged with the precharge voltage ($0.5*(V_H-V_L)$) (FIG. 4 at reference number 30). That is, in order to refresh the storage node (SN) in the unit cell, the high voltage ($V_{PP}$) is supplied to the word line (WL) to output and amplify the data stored in the unit cell and to store the data in the storage node (SN) again. For example, the bit line (BL) has a voltage level varies based on the data stored in the unit cell, and the logic high level voltage ($V_H$) or the logic level low voltage ($V_L$) is applied to the bit line (BL) by the sense amplifier (not shown). (FIG. 4 at reference number 32) The high gate voltage ($V_{HG}$) is supplied to the word line (WL), so that virtually no holes remain in the floating body (FB) through generation of hot carriers depending on the state of the data supplied to the bit line (BL) and, for example, the high data voltage ($V_{HD}$) or the logic level low ($V_L$) is applied to the bit line (BL) for refreshing the floating gate (FB) (FIG. 4 at reference number 34) After the refresh operation is finished, the semiconductor memory apparatus applies the inactive voltage ($V_{LL}$) to the word line (WL), and precharges the bit line (BL) with the precharge voltage ($0.5*(V_H-V_L)$). (FIG. 4 at reference number 36).

As mentioned above, in the write, read and refresh operations ((a) Write, (b) Read, and (c) Refresh Operations), a voltage having the same level as that of the precharge voltage ($0.5*(V_H-V_L)$) is supplied to a plate (Plate) connected to one side of the capacitor included in the unit cell.

Referring to FIG. 4, the unit cell of the semiconductor memory apparatus shown in FIG. 3 stores data of the unit cell with a different system in the two places (the floating body (FB) and the capacitor), respectively, and refreshes the two places to maintain the data. However, the semiconductor memory apparatus may read data of the unit cell not sequentially but simultaneously.

In case of the unit cell of the semiconductor memory apparatus shown in FIG. 3, the potential of the floating body becomes higher by the holes stored in the floating body of the transistor. When the inactive voltage ($V_{LL}$) is supplied to the word line to inactivate the unit cell and the logic low level ($V_L$) is supplied to the bit line by other unit cells, the junction between the floating body and the bit line proceeds forward although the unit cell is inactivated. That is, if the junction between the floating body and the bit line proceeds forward, the holes corresponding to the floating body dissipate in the inactivated unit cell where the data "1" is stored by the logic low level ($V_L$) corresponding to the data "0" transmitted to the other activated unit cell. While the inactive voltage ($V_{LL}$) is supplied to the word line, the logic low level ($V_L$) is determined so that the junction of the floating body whose potential becomes higher and the bit line to which the logic low level ($V_L$) is supplied may not proceed forward.

When the data "0" is written in the unit cell where the data "1" is stored, the high voltage ($V_{PP}$) is supplied to the word line to which the inactive voltage ($V_{LL}$) is supplied. As a result, the potential of the floating body instantly rises by coupling of gate capacitance and parasite capacitance of the floating body. However, when the data "0" is written, the potential of the floating body is required to be prevented from rising by the holes. The risen potential of the floating body is slipped out because the junction of the bit line to which the logic low level ($V_L$) is supplied corresponding to the data "0" proceeds forward.

A first voltage ($V_1$) includes a voltage required to maintain a backward direction when the holes are not stored in the floating body and a voltage rising part of the floating body by the stored holes. A second voltage ($V_2$) includes the first voltage ($V_1$) and a voltage rising part of the floating body resulting from change of the word line voltage from the inactive voltage ($V_{LL}$) to the high voltage ($V_{PP}$). The potential of the logic low level ($V_L$) corresponding to the data "0" is higher than the first voltage ($V_1$) and lower than the second voltage ($V_2$) ($V_1<V_L<V_2$).

The voltage of the inactivated bit line, which shares the same word line, maintains $0.5*(V_H-V_L)$ that is a precharge voltage having a higher potential than the logic low level ($V_L$). The logic high level ($V_H$) is determined so that the holes stored in the floating body (FB) in the inactivated unit that shares the word line (WL) may not be slipped out because the P-N junction with the bit line (BL) proceeds backward although the voltage of the word line changes from the inactive voltage ($V_{LL}$) to the high voltage ($V_{PP}$).

The relation of the logic high level ($V_H$) and the logic low level ($V_L$) for normally operating the unit cell of the semiconductor memory apparatus shown in FIG. 3 is as follows.

$$V_H > (V_L + 2 \times V_2)$$ [Equation 1]

That is, the logic high level ($V_H$) may be defined to be larger than a value obtained by adding the twice second voltage ($V_2$) to the logic low level ($V_L$).

The relation of the logic high level ($V_H$) and the logic low level ($V_L$) is to determine the range of values for storing the holes in the floating body of the unit cell and performing the normal operation of the semiconductor memory apparatus. Actually, in the semiconductor memory apparatus, voltages having various levels are used such as a power voltage ($V_{DD}$) and a ground voltage ($V_{SS}$) that are externally inputted, and the voltages are determined under consideration of the range of the logic level of the data that can be transmitted through circuits of a peripheral region except the unit cell.

Figure 1:
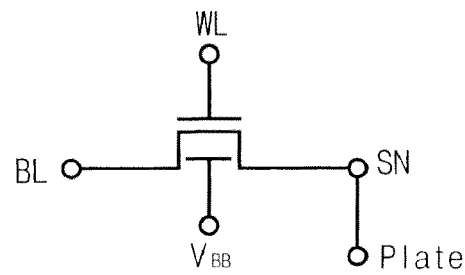
FIG. 1 is a circuit diagram illustrating a unit cell of a general semiconductor memory apparatus.

In comparison with the unit cell of the conventional memory apparatus shown in FIG. 1, when the data "1" is stored in the unit cell of the semiconductor memory apparatus according to an embodiment of the present invention, the holes are stored in the floating body to reduce a threshold voltage of the transistor, so that the data stored in the storage node can be outputted quickly. Furthermore, problems of the unit cell of the semiconductor memory apparatus may be solved by implementing devices according to embodiments of the present invention. On the other hand, when the data "0" may be stored in the unit cell of the semiconductor memory apparatus according to the embodiment of the present invention, the holes by hot carriers are not stored in the floating body, so that there is no difference in the data output speed from that of the conventional unit cell.

Moreover, a potential of the floating body rises with storage of the holes in the floating body while the unit cell is inactivated, so that a voltage supplied to the junction between the storage node and the floating body is reduced to decrease leakage currents. When the same charges are stored both in the unit cell according to the embodiment of the present invention and in the conventional unit cell of FIG. 1, the charges can be maintained for a longer time. That is, a refresh characteristic of the semiconductor memory apparatus is improved. Although the unit cell according to embodiments of the present invention includes a capacitor having smaller capacitance in comparison with the unit cell, a normal operation can be performed, and the size of the capacitor in the unit cell can be reduced. From the aspect of the refresh characteristic, when the data "0" is stored in the unit cell, data do not disappear by leakage currents. Therefore, the refresh characteristic of the semiconductor memory apparatus according to embodiments of the present invention is deemed to be improved.

As described above, the unit cell of the semiconductor memory apparatus according to embodiments of the present invention has structural features of a unit cell of a general DRAM and a floating body unit cell. Due to these features, in the semiconductor memory apparatus, both a capacitor for storing charges in the unit cell and a floating body for storing holes are used for storing data. Then, data stored in the unit cell is kept for sufficiently long time periods even though capacitance ($C_s$) of the capacitor in the unit cell is smaller than that the conventional DRAM. As a result, the size of the capacitor in the unit cell can be reduced to the extent of preventing the data in the unit cell from erasure. That is, the unit cell of the semiconductor memory apparatus according to the embodiment of the present invention has a smaller area than that of the conventional DRAM unit cell, thereby improving integration of the semiconductor memory apparatus.

The leakage currents resulting from the junction of the floating body and the storage node are reduced by the floating body whose potential rises due to storage of holes also improving the refresh characteristic which is otherwise degraded by reduction of the capacitance ($C_s$) of the conventional capacitor. Furthermore, the threshold voltage of the cell transistor is reduced by the floating body whose potential rises due to storage of holes, so that the data output from the unit cell becomes faster.

Accordingly, the unit cell of the semiconductor memory apparatus according to embodiments of the present invention has structural features of a unit cell of a general DRAM and a floating body unit cell, thereby reducing the size of the unit cell to decrease the entire area of the semiconductor memory apparatus. Moreover, the data output speed of the unit cell becomes faster to reduce leakage current, thereby improving the refresh characteristic and reducing the whole power consumption.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for operating a semiconductor memory apparatus, the method comprising:
    storing data in a capacitor in a unit cell based on a voltage difference between a bit line and a plate connected to one side of the capacitor in response to a write command;
    storing the data in a floating body of a transistor in the unit cell based on hot carriers generated by a voltage difference between a word line and the bit line during a write operation initiated by the write command;
    outputting data from the capacitor and the floating body of the unit cell in response to a read command; and
    sequentially refreshing the capacitor and the floating body in response to a refresh command.

2. The method according to claim 1, comprising maintaining a precharge voltage on a bit line and maintaining an inactivating voltage on the word line when the unit cell is not selected.

3. The method according to claim 2, comprising supplying a voltage having the same level as that of the precharge voltage to the plate.

4. The method according to claim 1, wherein storing data in the capacitor includes:
    supplying a first control voltage to the word line to store data transmitting a voltage of the bit line to the other side of the capacitor.

5. The method according to claim 4, wherein storing data in the floating body includes:
    supplying a second control voltage to the world line; and
    supplying a high data voltage having a higher level than a logic high level into the bit line to generate the hot carriers when the data is "1"; and
    supplying a logic low level corresponding into the bit line to prevent generation of the hot carriers when the data is "0".

6. The method according to claim 5, wherein the first control voltage is a higher voltage than a power voltage, and the second control voltage has a potential level within a range in ⅓ to ½ of the logic high level or the high data voltage level.

7. The method according to claim 5, wherein a potential level of the logic low level is higher than a first voltage and lower than a second voltage, if the first voltage includes a voltage required to maintain an inverse direction when the holes are not stored in the floating body and a voltage rising value of the floating body when the holes are stored, and the second voltage includes the first voltage and a voltage rising value of the floating body depending on a potential of the word line which changes from an inactivating voltage to a high voltage.

8. The method according to claim 1, wherein sequentially refreshing the capacitor and the floating body includes:
    supplying a first control voltage to a word line to output and amplify data from the unit cell;
    supplying the first control voltage to the word line to store data transmitted to the bit line in the capacitor;
    supplying a second control voltage to the word line to store the data in the floating body; and
    supplying an inactivating voltage to the word line to inactivate the unit cell.

9. The operating method according to claim 8, wherein the first control voltage is a higher voltage than a power voltage, and the second control voltage is either within a range of ⅓~½ of a logic high level voltage corresponding to data "1" or the high data voltage level.

10. The operating method according to claim 8, wherein the inactivating voltage has a lower potential level than the logic low level corresponding to data "0".

11. A method for operating a semiconductor memory apparatus, the method comprising:
    supplying a voltage into a bit line corresponding to a data to be written;
    supplying a high voltage to a word line to active a unit cell;
    charging a capacitor in the unit cell by transmitting the voltage of the bit line to store the data;
    supplying a high gate voltage to the word line to generate hot carriers in a junction region of the bit line;
    storing the data in a floating body of the unit cell based on the generation of the hot carriers; and
    supplying an inactivating voltage to the word line to inactivate the unit cell.

* * * * *